United States Patent
Kondo et al.

(10) Patent No.: US 6,811,950 B2
(45) Date of Patent: Nov. 2, 2004

(54) PRESENSITIZED PLATE USEFUL FOR MAKING LITHOGRAPHIC PRINTING PLATE AND METHOD FOR MAKING LITHOGRAPHIC PRINTING PLATE THEREFROM

(75) Inventors: Shunichi Kondo, Shizuoka-Ken (JP); Fumikazu Kobayashi, Shizuoka-Ken (JP); Mitsumasa Tsuchiya, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 175 days.

(21) Appl. No.: 10/055,002

(22) Filed: Jan. 25, 2002

(65) Prior Publication Data

US 2002/0155382 A1 Oct. 24, 2002

(30) Foreign Application Priority Data

Feb. 7, 2001 (JP) .......................... 2001-030976

(51) Int. Cl.$^7$ .................. G03F 7/038; G03F 7/105; G03F 7/11
(52) U.S. Cl. ................ 430/271.1; 430/278.1; 430/281.1; 430/286.1; 430/302; 430/434; 430/435; 101/453; 101/463.1; 101/466; 101/494
(58) Field of Search ................ 430/270.1, 271.1, 430/278.1, 281.1, 286.1, 287.1, 288.1, 302, 494, 401, 434, 435; 101/453, 454, 457, 463.1, 465, 466

(56) References Cited

U.S. PATENT DOCUMENTS 4,983,498 A * 1/1991 Rode et al. ............ 430/284
6,258,510 B1 * 7/2001 Maemoto ............... 430/278.1

FOREIGN PATENT DOCUMENTS

JP 2000-039711 A * 2/2000 ........... G03F/7/028

* cited by examiner

Primary Examiner—Barbara Gilliam
(74) Attorney, Agent, or Firm—Burns, Doane, Swecker & Mathis, LLP

(57) ABSTRACT

The present invention relates to a presensitized plate useful for making a lithographic printing plate comprising an intermediate layer and a photopolymerizable photosensitive layer on an aluminum substrate in this order, wherein the roughness of a surface of said aluminum substrate (Ra) is in the range of 0.2 to 0.55 μm and the intermediate layer comprises a polymer compound comprising at least one monomer unit having a sulfonic acid group and a method for making a lithographic printing plate by imagewise exposing the presensitized plate described above and developing the imagewise exposed presensitized plate with a developer comprising an inorganic alkali salt and a nonionic surfactant comprising a polyoxyalkylene ether group. The presensitized plate or the method of the present invention provides a lithographic printing plate showing good contrast between an image area and non-image area, no background contamination during printing, good stability with time and good printing durability.

6 Claims, No Drawings

US 6,811,950 B2

PRESENSITIZED PLATE USEFUL FOR MAKING LITHOGRAPHIC PRINTING PLATE AND METHOD FOR MAKING LITHOGRAPHIC PRINTING PLATE THEREFROM

BACKGROUND OF THE INVENTION

The present invention relates to a presensitized plate useful for making a lithographic printing plate (hereinafter referred to as "PS plate") and a method for making a lithographic printing plate therefrom. More specifically, the present invention relates to a PS plate showing an improved developability (i.e., PS plate can be sufficiently developed by a developer) and a resistance to a damage during development to give a lithographic printing plate which is not easily contaminated during printing process and has a strong image, and relates to a method for making such a lithographic printing plate from the PS plate.

When a lithographic printing plate is used to prepare printings, it is important to obtain printings with no background contamination. Generally, the occurrence of background contamination in printings increases with the storage time of a PS plate after production. In particular, this phenomenon becomes more intense when the PS plate has been stored under a high temperature and high humidity. It is particularly difficult to stably store a PS plate having a photopolymerizable photosensitive layer for a long time since a radical easily generates to initiate a chain polymerization reaction in the photopolymerizable photosensitive layer when the PS plate is exposed to light. Accordingly, there has been a demand to obtain a PS plate that can be stably kept for a long time, especially under a high temperature and high humidity and that can provide a lithographic printing plate which does not cause any background contamination.

Many attempts have been made to eliminate the background contamination. For instance, the following PS plates or methods disclosed in various publications are known; a PS plate comprising a basecoat layer consisting of polyvinylphosphonic acid coated on a surface of an anodized aluminum plate and a photosensitive layer coated thereon comprising a diazo compound (German Patent No. 1,621,478), a PS plate comprising a basecoat layer of polyacrylic acid that is coated on an aluminum substrate and a layer of diazo resin coated on the basecoat layer (German Patent No. 1,091,433), a PS plate comprising a basecoat layer of polyacrylamide and a photosensitive layer coated thereon (U.S. Pat. No. 3,511,661), a method to add an organic acid polymer compound to a photosensitive layer comprising a diazo compound and organic polymer carrier to improve the stability with time of a PS plate comprising the photosensitive layer, thereby inhibiting generation of a background contamination of the PS plate (Japanese Un-examined Patent Publication (hereunder referred to as "J.P. KOKAI") No. Sho 56-107238). However, these PS plates are still insufficient and a further improvement is required. J.P. KOKAI No. 57-5042 discloses a photo-addition composition comprising a combination of a diazo resin having plural diazonium groups on the side chain and a sulfonated polymer comprising plural sulfonate groups (for example, sulfonated polyurethane and sulfonated polyester). However, the effect of the composition to inhibit the background contamination is not sufficient and further, the utility of the PS plate is restricted since the performance of the plate is highly influenced by the sulfonated polyurethane or sulfonated polyester used in the photosensitive layer.

J.P. KOKAI No. 59-101651 discloses a method to improve the background contamination of a PS plate having a photosensitive layer comprising a diazo compound and a photopolymerizable compound when the plate is kept for a long time, which the method comprises coating a polymer comprising a monomer unit having a sulfonic acid as an intermediate layer. The storage stability of the PS plate was improved by the method when the PS plate has such a poorly sensitive photopolymerizable photosensitive layer that can be treated with a conventional PS plate-exposing device. However, the effect is not sufficient when the PS plate has a highly sensitive photopolymerizable photosensitive layer which is exposed to laser light as used for CTP technique.

The method to deposit a basecoat layer comprising a compound highly soluble in a developer or the method to add such a compound to the photopolymerizable photosensitive layer is effective for improving the background contamination property of a PS plate. But an irradiated portion of the photopolymerizable photosensitive layer of the PS plate is severely damaged by development and the printing durability of the PS plate is also deteriorated.

A conventional negative-working PS plate that has been widely used is such a plate that a diazo resin is coated on an aluminum plate which has been treated so that the surface becomes hydrophilic. In order to develop the plate, a developer containing an organic solvent should be used. However, use of such a developer may cause problems such as disposal of a waste developer and influence of the waste developer on an environment. A positive-working PS plate usually comprises an orthoquinonediazide compound together with a novolak resin. An alkali solution of a silicate salt should be used as a developer for such a plate and the developer should have a pH of around 13 to dissolve the novolak resin. The developer having such a high pH irritates skin and mucous membrane of a worker and thus, such a developer should be carefully treated.

There has been utilized a PS plate comprising a photopolymerizable photosensitive layer on an aluminum substrate. As a developer for the PS plate, an aqueous solution of silicate, phosphate, carbonate or hydroxide of an alkali metal or organic amine compound has been proposed.

For example, J.P. KOKAI No. Hei 8-248643 discloses a developer having a high pH of at least 12 and comprising an alkali silicate and an amphoteric surfactant. J.P. KOKAI No. Hei 11-65129 discloses a developer having a pH of 12 or lower, wherein the ratio $SiO_2/M_2O$ (M is alkali metal) is specified.

The former developer having such a high pH has a problem, in addition to the handling problem, that an image area of a PS plate is easily damaged when the PS plate is developed. The latter developer has a problem that the contained silicate easily gels and becomes insoluble due to the decrease of the pH of the developer during the developing process.

A developer comprising no alkali silicate is described, for example, in J.P. KOKAI No. Sho 61-109052 which discloses a developer comprising an alkaline agent, a complexing agent, an anionic surfactant, an emulsifying agent and n-alkanoic acid, and in German Patent No. 1984605 which discloses a developer comprising an alkaline agent, a complexing agent, an anionic surfactant, amyl alcohol, and N-alkoxyamine. However, it is difficult to obtain a good printing performance such as printing durability since both the developers have high pH and comprise an organic solvent which causes damages of image area.

A developer having a relatively low pH (12 or less) with no alkali silicate is described, for example, in J.P.KOKAI No.2000-81711 which discloses a developer comprising an aqueous solution of potassium hydroxide comprising an anionic surfactant, and in J.P. KOKAI No. Hei 11-65126 which discloses a developer comprising an aqueous solution of alkali metal carbonate having pH ranging from 8.5 to 11.5.

However, such a developer having a relatively low pH poorly dissolves photopolymerizable photosensitive layer and thus, may cause problems such as a remain of a film in a non-image area of the photosensitive layer, particularly when the utilized PS plate is an aged one (that is, the plate has been stored for a long time after production). In order to solve the problem, it is necessary to improve the developability by increasing an acid number of a binder polymer in the photosensitive layer of the PS plate, or by use of an additional monomer having an acid group in the binder polymer. But, when such a binder polymer having a higher acid number is used, it often causes a problem in a printing process such as a blinding, that is, an ink does not adhere to the PS plate during the printing process.

SUMMARY OF THE INVENTION

Thus, the purpose of the present invention is to provide a photopolymerizable presensitized plate useful for making a lithographic printing plate which has a stability with time and does not cause any background contamination when the plate is used to make printings after exposed to light and developed, even the plate is kept for a long time under a high temperature and high humidity. More specifically, the purpose of the present invention is to provide a presensitized plate useful for making a lithographic printing plate (PS plate) and to provide a method for making a lithographic printing plate from the PS plate, wherein the lithographic printing plate shows a stable and good developability, has an increased image strength and causes no background contamination during printing process and no damage in the image area during development even if the PS plate is developed with an alkali developer having a relatively low pH, which is preferably used from the viewpoint of environmental protection and safety.

The inventors of the present invention have found that a lithographic printing plate showing no background contamination can be obtained when a surface roughness of a substrate is relatively small and an intermediate layer comprising a polymer compound comprising a sulfonic acid group-containing monomer unit is formed. In addition, the inventors of the present invention have found that a dissolution rate of a non-irradiated portion of the photopolymerizable photosensitive layer to a developer can be increased and a penetration of a developer to an image area (a portion crosslinked via photopolymerization) can be inhibited to make a solid film, by use of an aqueous alkali solution having a relatively low pH and comprising a specific concentration of a salt and a specific nonionic surfactant.

Thus, the present invention provides a presensitized plate useful for making a lithographic printing plate comprising an intermediate layer and a photopolymerizable photosensitive layer on an aluminum substrate in this order, wherein the roughness of the surface of said aluminum substrate (Ra) is in the range of 0.2 to 0.55 $\mu$m and the intermediate layer comprises a polymer compound comprising at least one monomer unit having a sulfonic acid group.

Preferably, said monomer unit comprising a sulfonic acid group in the polymer compound of the intermediate layer is derived from at least one monomer selected from the group consisting of p-styrenesulfonic acid, 2-acrylamide-2-methylpropanesulfonic acid, ethylenesulfonic acid, alkali metal salt thereof, ammonium salt thereof and aqueous amine salt thereof.

Also, the present invention provides a method for making a lithographic printing plate by imagewise exposing the presensitized plate described above and developing the imagewise exposed presensitized plate with a developer comprising an inorganic alkali salt and a nonionic surfactant comprising a polyoxyalkylene ether group.

The thus obtained lithographic printing plate shows no contamination during the printing process even after being stored for a long time and an image area of the lithographic printing plate becomes solid film to thus result in a high printing durability and a high resistance to a solvent.

DESCRIPTION OF THE PREFERRED EMBODIMENTS

Hereinafter, the present invention will be explained more specifically.

(Aluminum Substrate)

An aluminum substrate usable in the present invention will be described. The aluminum substrate usable in the present invention desirably consists of an aluminum having a high dimensional stability, an alloy thereof with silicon, copper, manganese, magnesium, chromium, zinc, lead, bismuth or nickel, or a plastic film or a paper which is laminated or deposited with an aluminum or aluminum alloy. Generally, the thickness of the substrate ranges from about 0.05 mm to about 1 mm. Besides, a composite sheet as disclosed in Japanese Patent Publication for Opposition Purpose (hereunder referred to as "J.P. KOKOKU") No. Sho 48-18327 is also preferably used in the present invention.

The aluminum substrate used in the present invention is characterized in that the surface roughness thereof ranges from 0.2 to 0.55 $\mu$m. In order to obtain the roughness of the surface in such a range, the substrate is surface-treated as described hereinafter.

In the present specification, the term "surface roughness" or "roughness of the surface" of the aluminum substrate means centerline average roughness (arithmetic mean roughness) (Ra) at right angles with the aluminum-rolling direction. Ra is defined by the following formula and expressed in $\mu$m.

$$Ra = \frac{1}{L}\int_0^L |f(X)|dX$$

In the formula, L is a measured length in the direction of centerline of roughness curve which is obtained using a probe (feeler), and the roughness curve is expressed as Y=f(X), wherein X is an axis of centerline and Y is an axis in the direction rectangular to X axis. The determination of L and the average roughness is conducted as described in JIS B 0601.

(Surface Graining)

Preferred surface graining methods of aluminum plates include mechanical surface graining, chemical etching, and electrolytic graining as disclosed in J.P. KOKAI No. Sho 56-28893. The surface graining methods further include, for instance, an electrochemical graining in an electrolyte such as hydrochloric acid or nitric acid, and a mechanical graining such as a wire brush graining wherein an aluminum surface is scrabbled with a metal wire, a ball graining wherein an aluminum surface is grained with an abrasive ball and abrasive, a brush graining wherein an aluminum surface is grained with a nylon brush and abrasive.

Moreover, these methods can be used alone or in a combination. Among them, a suitable surface graining method used in the present invention is the electrochemical method wherein the surface is grained chemically in an electrolyte such as hydrochloric acid or nitric acid with an electric current density ranging from 100 C/dm$^2$ to 400 C/dm$^2$. More specifically, electrolysis is preferably conducted in 0.1 to 50% of hydrochloric acid or nitric acid at 20 to 100° C. for 1 second to 30 minutes with an electric current density ranging from 100 C/dm$^2$ to 400 C/dm$^2$.

The thus grained aluminum substrate is further chemically etched with an acid or an alkali. Use of an acid as an etching agent is industrially disadvantageous since it takes a long time to destroy the micro structure of the plate, but use of an alkali as the etching agent solves this problem.

Suitable alkali agents usable in the present invention include sodium hydroxide, sodium carbonate, sodium aluminate, sodium metasilicate, sodium phosphate, potassium hydroxide and lithium hydroxide. A preferable concentration of the alkali agent ranges from 1 to 50% and a preferable temperature for the treatment with the alkali agent ranges from 20 to 100° C. In addition, a preferred condition for the treatment can be selected so that an amount of the dissolved aluminum becomes in the range of 5 to 20 g/m$^3$.

In order to remove a smut remained on the etched surface of an aluminum plate, the plate may be washed with an acid. Examples of the acid to be used include nitric acid, sulfuric acid, phosphoric acid, chromic acid, hydrofluoric acid and fluoboric acid. In particular, preferred smut-removing methods after electrochemical surface graining include a method to contact the plate with 15 to 65% by weight sulfuric acid solution at 50 to 90° C. as disclosed in J.P. KOKAI No. Sho 53-12739, and a method of alkali etching as disclosed in J.P. KOKOKU No. Sho 48-28123.

The aluminum substrate may be treated as described above to make the surface roughness (Ra) of the substrate within the range of 0.2 to 0.55 $\mu$m.

(Anodization)

Thus treated aluminum substrate is preferably further subjected to an anodization. The anodization can be conducted by any conventional method known in the art. More specifically, an anodized layer can be formed on the surface of an aluminum substrate by passing a direct or alternating current therethrough in an aqueous solution or non-aqueous solution (i.e., in an electrolyte) comprising sulfuric acid, phosphoric acid, chromic acid, oxalic acid, sulfamic acid, benzenesulfonic acid or a combination thereof.

The conditions for the anodization can be variously changed depending on the kind of the electrolyte used. But, in general, the anodization is preferably performed in an electrolyte having a concentration ranging from 1 to 80% by weight, at a temperature ranging from 5 to 70° C., with a current density ranging from 5 to 60 A/dm$^2$ and a voltage ranging from 1 to 100 V for seconds to 5 minutes.

Among the anodization treatments, particularly a method to anodize in sulfuric acid using a high current density described in U.K. Patent No.1,412,768, and a method to anodize using phosphoric acid as an electrolyte described in U.S. Pat. No. 3,511,661 are preferred.

The amount of the anodized layer is preferably in the range of 1 to 10 g/m$^2$. If it is less than 1 g/m$^2$, the resulting lithographic printing plate has insufficient printing durability and the non-image portion thereof is easily damaged. If it is higher than 10 g/m$^2$, it requires a large amount of electricity to produce the plate to result in an economical disadvantage.

Moreover, the aluminum plate may be subjected to a sealing treatment after the surface-graining and anodization treatments. Such a sealing treatment is performed by immersing the aluminum plate in a hot water or a hot aqueous solution containing an inorganic or organic salt or by treating the plate in a steam bath. In addition, the aluminum plate may be further subjected to other treatments such as a surface treatment with a silicate (e.g., alkali metal silicate) and a dipping treatment to dip the substrate into an aqueous solution comprising a potassium fluorozirconate or a phosphonic acid salt.

The PS plate of the present invention can be prepared by forming an intermediate layer and a photosensitive layer on the thus surface-treated aluminum substrate in this order.

(Intermediate Layer)

The present invention is characterized by use of a polymer compound comprising at least one monomer unit having a sulfonic acid group in an intermediate layer. The aluminum plate having the intermediate layer comprising the polymer compound between a substrate and a photosensitive layer is not easily contaminated during the printing process even after being stored for a long time.

Examples of the monomer unit having a sulfonic acid group in the polymer compound of the intermediate layer include p-styrenesulfonic acid, 2-acrylamide-2-methylpropanesulfonic acid, ethylenesulfonic acid, 2-chloroethylenesulfonic acid, ethylenedisulfonic acid, 1-propene-1-sulfonic acid, 1-propene-2-sulfonic acid, 2-methyl-1,3-propenedisulfonic acid, 1-butene-1-sulfonic acid, 1-pentene-1-sulfonic acid, 1-hexene-1-sulfonic acid, 2-phenylethylenesulfonic acid, 1-methyl-2-phenylethylenesulfonic acid, 3-chloroallylsulfonic acid, allylsulfonic acid, 3-chloro-2-butenesulfonic acid, 3-chlorometaallylsulfonic acid, metaallylsulfonic acid, 3-methyl-2-butene-2-sulfonic acid, 3-phenylallylsulfonic acid, 3-phenylmetaallylsulfonic acid, 2-benzylallylsulfonic acid, 2-chloro-4-styrenesulfonic acid, vinyltoluenesulfonic acid, and $\alpha$-methylstyrenesulfonic acid as well as alkali metal salt, ammonium salt and aqueous salt thereof. More preferably, at least one monomer unit comprising a sulfonic acid is derived from at least one monomer selected from the group consisting of p-styrenesulfonic acid, 2-acrylamide-2-methylpropanesulfonic acid, ethylenesulfonic acid, alkali metal salt thereof, ammonium salt thereof, and aqueous amine salt thereof.

The polymer compound may be prepared by polymerizing one or more monomers described above or by copolymerizing one or more monomers described above with other monomers. Such other monomers may be any monomer that can be copolymerized with the monomer comprising a sulfonic acid group, but preferable examples thereof include alkyl acrylates (e.g., methyl acrylate, ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, 2-hydroxyethyl acrylate and the like), alkyl methacrylates (methyl methacrylate, ethyl methacrylate, n-propyl methacrylate, isopropyl methacrylate, n-butyl methacrylate, isobutyl methacrylate, n-amyl methacrylate, 2-ethylhexyl methacrylate, n-octyl methacrylate, n-decyl methacrylate, 2-hydroxyethyl methacrylate and the like), styrenes (styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, o-sec-butylstyrene, o-tert-butylstyrene, p-fluorostyrene, 2,5-difluorostyrene, o-chlorostyrene, m-chlorostyrene, p-chlorostyrene, 2,4-dichlorostyrene, 2,5-dichlorostyrene, 2,6-dichlorostyrene, 3,4-dichlorostyrene, p-bromostyrene, p-cyanostyrene and the like), acrylonitrile, methacrylonitrile, acrylamide, N-sec-butylacrylamide, N-tert-butylacrylamide, N,N-dibutylacrylamide, N-tert-butylmethacrylamide, acrylic acid, methacrylic acid, vinyl acetate, and the like.

The molecular weight of the polymer compound in the intermediate layer usable in the present invention may not be restricted to a specific range, provided that the polymer compound is soluble in a solvent. But generally, it ranges from about 1,000 to 1,000,000, preferably from 2,000 to 100,000, and most preferably from 10,000 to 100,000, by weight-average molecular weight.

In addition, the amount of the monomer unit having a sulfonic acid group in the polymer compound may be in a wide range, suitably in the range of from about 1 to 100% by mole and more preferably from 5 to 100% by mole.

The polymer compound in the intermediate layer of the present invention may be prepared by conventionally known methods. For example, the polymer compound may be obtained by a solution polymerization method and, optionally by neutralizing the acid group in the polymerized product. The solution polymerization method is generally conducted by polymerizing a starting monomer in a solvent that solves the monomer, such as isopropyl alcohol, in the presence of an initiator of polymerization under a nitrogen atmosphere. Also, it is possible to obtain the polymer as an aqueous dispersion by emulsifying the starting monomer in water with a surfactant and polymerizing the monomer in the presence of an initiator of polymerization such as potassium persulfate. It is also possible to obtain the polymer compound as a solid from the dispersion.

The polymer compound described above may be dissolved in a suitable solvent and may be coated on a substrate by conventionally known methods.

The amount of the coated polymer compound varies depending on the compound to be used, but suitably ranges from approximately 0.0001 to 1 $g/m^2$. If the amount is less than 0.0001 $g/m^2$, the effect of the present invention to inhibit the generation of background contamination is not sufficient, while if it exceeds 1 $g/m^2$, printing durability of the plate becomes insufficient. Accordingly, the amount is preferably in the range of 0.0005 to 0.2 $g/m^2$.

The coating solution for the intermediate layer may comprise suitable additives such as a pH regulator, e.g., phosphoric acid, phosphorous acid, hydrochloric acid, and lower molecular organic sulfonic acid, and a wetting agent, e.g, saponin.

(Photosensitive Layer)

The photopolymerizable photosensitive layer usable in the present invention is prepared from photopolymerizable photosensitive composition (hereinafter, referred to as "photopolymerizable composition"). The photopolymerizable composition comprises an addition polymerizable or ethylenically unsaturated bond-containing compound, a photopolymerization initiator, and a polymer binder, and optionally comprises a variety of compounds such as a coloring agent, plasticizer, heat polymerization inhibitor and the like.

The ethylenically unsaturated bond in the ethylenically unsaturated bond-containing compound will be addition polymerized to cross-link or cure the compound when the photopolymerizable composition is exposed to active light. The compound comprising the addition polymerizable or ethylenically unsaturated bond may be selected from the group consisting of compounds comprising at least one, preferably two or more terminal ethylenically unsaturated bonds, which are in the form of, for example, a monomer, prepolymer (i.e., oligomer such as a dimer and trimer), copolymer and a mixture thereof.

Examples of the monomer and copolymer comprising an ethylenically unsaturated bond include an ester of unsaturated carboxylic acid (e.g., acrylic acid, methacrylic acid, itaconic acid, crotonic acid, isocrotonic acid, and maleic acid) and aliphatic polyol, and an amide of unsaturated carboxylic acid and aliphatic polyamine. Examples of the ester monomer of unsaturated carboxylic acid and aliphatic polyol include an acrylic acid ester such as ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer and the like.

Examples of methacrylic acid ester include tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]-dimethylmethane, bis-[p-(methacryloxyethoxy)phenyl]dimethylmethane and the like.

Examples of itaconic acid ester include ethyleneglycol diitaconate, propyleneglycol diitaconate, 1,5-butanediol diitaconate, 1,4-butanediol diitaconate, tetramethyleneglycol diitaconate, pentaerythritol diitaconate, sorbitol tetraitaconate and the like.

Examples of crotonic acid ester include ethyleneglycol dicrotonate, tetramethyleneglycol dicrotonate, pentaerythritol dicrotonate, sorbitol tetradicrotonate and the like.

Examples of isocrotonic acid ester include ethyleneglycol diisocrotonate, pentaerythritol diisocrotonate, sorbitol tetraisocrotonate and the like.

Examples of maleic acid ester include ethyleneglycol dimaleate, triethyleneglycol dimaleate, pentaerythritol dimaleate, sorbitol tetramaleate and the like. Further, mixtures of the aforementioned ester monomers are also included.

Examples of amide monomer of aliphatic polyamine compound and unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide and the like.

Other examples include vinylurethane compound comprising two or more polymerizable vinyl groups in a molecule, prepared by an addition reaction of a vinyl monomer having a hydroxyl group represented by the following formula (A) with a polyisocyanate compound having two or more isocyanate groups as disclosed in J.P. KOKOKU No. Sho 48-41708.

$$CH_2=C(R^1)COOCH_2CH(R^2)OH \quad (A)$$

(wherein $R^1$ and $R^2$ each represents H or $CH_3$.)

Also, urethane acrylates as described in J.P. KOKAI No. Sho 51-37193, J.P. KOKOKU No. Hei 2-32293, polyfunctional acrylates or methacrylates such as epoxyacrylate prepared from epoxy resin and (meth)acrylic acid, and polyester acrylates as described in J.P. KOKAI No. Sho 48-64183, J.P. KOKOKU No. Sho 49-43191, and J.P. KOKOKU No. Sho 52-30490, can be utilized as the compound comprising an ethylenically unsaturated bond. In addition, a photo-setting monomer and oligomer as described in "Bulletin of Japan Adhesive Association Vol.20, No.7, p.300–308 (1984)" can be utilized. The amount of the ethylenically unsaturated bond-containing compound ranges 5 to 80% by weight and preferably from 30 to 70% by weight on the basis of the total weight of the photosensitive layer.

The initiator of photopolymerization usable in the photosensitive layer in the PS plate of the present invention can be selected from various initiators of photopolymerization reported in many patents and publications, or from various combinations of two or more initiators of photopolymerization (photoinitiation system), depending on the wavelength of the light source to be used. Specific examples thereof will be described below, but not limited thereto.

There have been proposed various photoinitiation systems which can be used for visible light rays having 400 nm or longer, Ar laser, secondary harmonics of semiconductor laser, or SHG-YAG laser as a light source. For instance, a certain dye capable of being photolytically reduced such as Rose Bengale, Eosine, and Erythrosine (U.S. Pat. No. 2,850,445); a combination system of a dye and an initiator such as a combined initiator system comprising a dye and an amine (J.P. KOKOKU No. Sho 44-20189); a system comprising hexaarylbiimidazole, a radical initiator and a dye (J.P. KOKOKU No. Sho 45-37377); a system comprising a hexaarylbiimidazole and a p-dialkylaminobenzylidene ketone (J.P. KOKOKU No. Sho 47-2528 and J.P. KOKAI No. Sho 54-155292); a system comprising a cyclic cis-α-dicarbonyl compound and a dye (J.P. KOKAI No. Sho 48-84183); a system comprising a substituted triazine and a merocyanine dye (J.P. KOKAI No. Sho 54-15102); a system comprising a 3-keto-substituted coumarin compound and an active halogen atom-containing compound (J.P. KOKAI No. Sho 52-112681, J.P. KOKAI No. Sho 58-15503); a system comprising biimidazole, styrene derivative, and thiol (J.P. KOKAI No. Sho 59-140203); a system comprising an organic peroxide compound and a pigment (J.P. KOKAI No. Sho 59-1504, J.P. KOKAI No. Sho 59-140203, J.P. KOKAI No. Sho 59-189340, J.P. KOKAI No. Sho 62-174203, J.P. KOKOKU No. Sho 62-1641, U.S. Pat. No. 4766055); a system comprising a dye and an active halogenated compound (J.P. KOKAI No. Sho 63-258903, J.P. KOKAI No. Hei 2-63054 and the like); a system comprising a dye and a borate compound (J.P. KOKAI No. Sho 62-143044, J.P. KOKAI No. Sho 62-150242, J.P. KOKAI No. Sho 64-13140, J.P. KOKAI No. Sho 64-13141, J.P. KOKAI No. Sho 64-13142, J.P. KOKAI No. Sho 64-13143, J.P. KOKAI No. Sho 64-13144, J.P. KOKAI No. Sho 64-17048, J.P. KOKAI No. Hei 1-229003, J.P. KOKAI No. Hei 1-298348, J.P. KOKAI No. Hei 1-138204 and the like); a system comprising a dye having a rhodanine ring and a radical generator (J.P. KOKAI No. Hei 2-179643, J.P. KOKAI No. Hei 2-244050); a system comprising a titanocene and 3-keto-substituted coumarin compound (J.P. KOKAI No. Sho 63-221110); a system comprising titanocene, xanthene dye, and an addition polymerizable compound having an ethylenically unsaturated bond and an amino group or a urethane group (J.P. KOKAI No. Hei 4-221958, J.P. KOKAI No. Hei 4-219756); a system comprising a titanocene and a specific merocyanine dye (J.P. KOKAI No. Hei 6-295061); and a system comprising a titanocene and a dye having a benzopyran ring (J.P. KOKAI No. Hei 8-334897).

In addition, a laser having a wavelength ranging from 400 to 410 nm (violet laser) was developed and also, a photoinitiation system highly sensitive to the wavelength of 450 nm or shorter was recently developed. Therefore, such a photoinitiation system also can be utilized. Examples thereof include a system comprising a cationic dye/borate (J.P. KOKAI No. Hei 11-84647), a system comprising a merocyanine dye/titanocene (J.P. KOKAI No. 2000-147763), carbazole dye/titanocene (Japanese Patent Application No. Hei 11-221480) and the like. In particular, a system comprising a titanocene compound is preferably used in view of its high sensitivity.

In the present invention, any titanocene compound can be utilized, but a suitable titanocene compound can be selected from various titanocene compounds including, for example, those described in J.P. KOKAI No. Sho 59-152396 and J.P. KOKAI No. Sho 61-151197. More specifically, examples of the titanocene compound include di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-di-fluorophen-1-yl, di-methylcyclopentadienyl-Ti-bis-2,3,4,5,6-tetrafluorophen-1-yl, di-methylcyclopentadienyl-Ti-bis-2,6-difluorophen-1-yl, di-cyclopentadienyl-Ti-bis-2,6'-difluoro-3-(pyr-1-yl)-phen-1-yl and the like.

Preferred dyes to be used with the titanocene compound include cyanine dyes, merocyanine dyes, xanthene dyes, ketocoumarin dyes, and benzopyran dyes. A preferred cyanine dye is represented by the following formula, but not limited thereto.

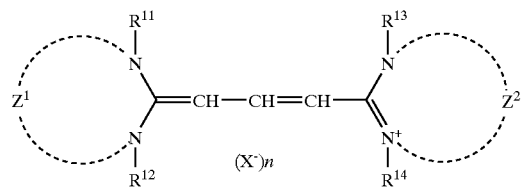

wherein $Z^1$ and $Z^2$ are the same or different and represent a nonmetallic atom necessary to form a benzimidazole or naphthoimidazole ring; $R^{11}$, $R^{12}$, $R^{13}$ and $R^{14}$ each represents an optionally substituted alkyl group; $X^-$ represents a counter anion and n represents 0 or 1.

Specific embodiments of cyanine dyes are described in Table 1.

TABLE 1

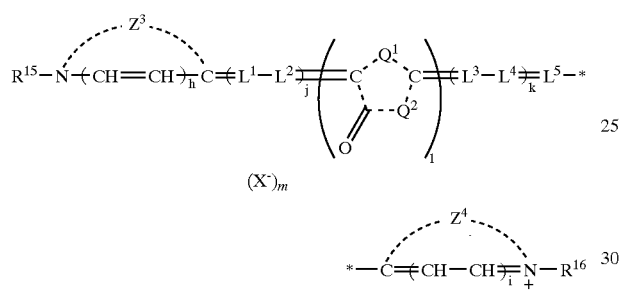

| R¹¹ | R¹² | R¹³ | R¹⁴ | A¹ | A² | A³ | A⁴ | X⁻ | n |
|---|---|---|---|---|---|---|---|---|---|
| $C_2H_5$ | $C_2H_5$ | $C_2H_5$ | $C_2H_5$ | Cl | Cl | Cl | Cl | I⁻ | 1 |
| $C_2H_5$ | $C_2H_5$ | $C_2H_5$ | $C_2H_5$ | H | $CF_3$ | H | $CF_3$ | I⁻ | 1 |
| $C_2H_5$ | $(CH_2)_2SO_3Na$ | $C_2H_5$ | $(CH_2)_2SO_3^-$ | Cl | Cl | Cl | Cl | — | 0 |

Preferred examples of merocyanine dyes are shown below, but not limited thereto.

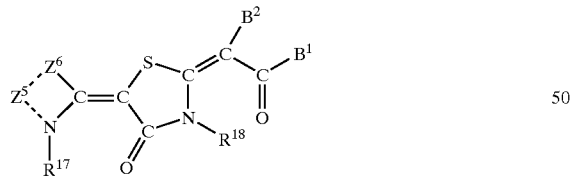

In the above formula, $Z^3$ and $Z^4$ each represents a non-metallic atomic group necessary for forming a 5-membered and/or 6-membered nitrogen-containing heterocyclic ring that is typically contained in cyanine dyes. $R^{15}$ and $R^{16}$ each represents an alkyl group. $Q^1$ and $Q^2$ are atomic groups necessary for forming 4-thiazolinone ring, 5-thiazolinone ring, 4-imidazolidinone ring, 4-oxazolidinone ring, 5-oxazolidinone ring, 5-imidazolidinone ring or 4'-dithiolanone ring. $L^1, L^2, L^3, L^4$ and $L^5$ each represents methine group. "m" represents 1 or 2. "i" and "h" each represents 0 or 1. "l" represents 1 or 2. "j" and "k" each represents 0, 1, 2 or 3. X represents a counter anion.

In the above formula, $R^{17}$ and $R^{18}$ each independently represents a hydrogen atom, alkyl group, substituted alkyl group, alkenyl group, substituted alkenyl group, alkynyl group, substituted alkynyl group, alkoxycarbonyl group, aryl group, substituted aryl group or aralkyl group. $Z^6$ represents an oxygen atom, sulfur atom, selenium atom, tellurium atom, alkyl or aryl-substituted nitrogen atom, or dialkyl-substituted carbon atom. $Z^5$ represents non-metallic atoms necessary to form a heterocyclic 5-membered ring containing a nitrogen atom. $B^1$ represents a substituted phenyl group, unsubstituted or substituted polynuclear aromatic ring, or unsubstituted or substituted heteroaromatic ring. $B^2$ represents a hydrogen atom, alkyl group, substituted alkyl group, aryl group, substituted aryl group, aralkyl group, alkoxyl group, alkylthio group, arylthio group, substituted amino group, acyl group, or alkoxycarbonyl group, or $B^2$ and $B^1$ may be linked together to form a ring.

Examples of merocyanine dyes are shown below.

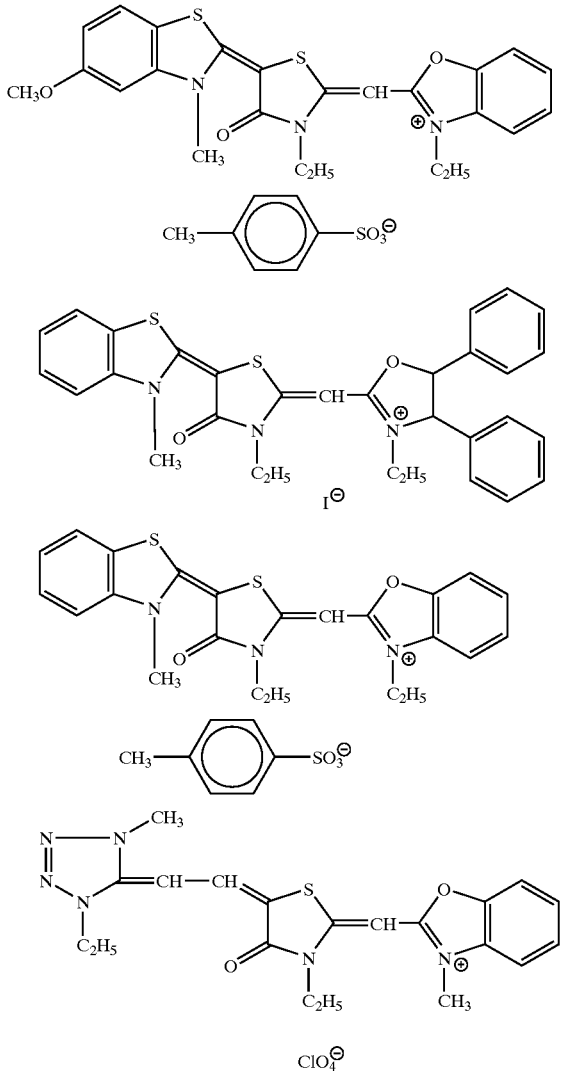

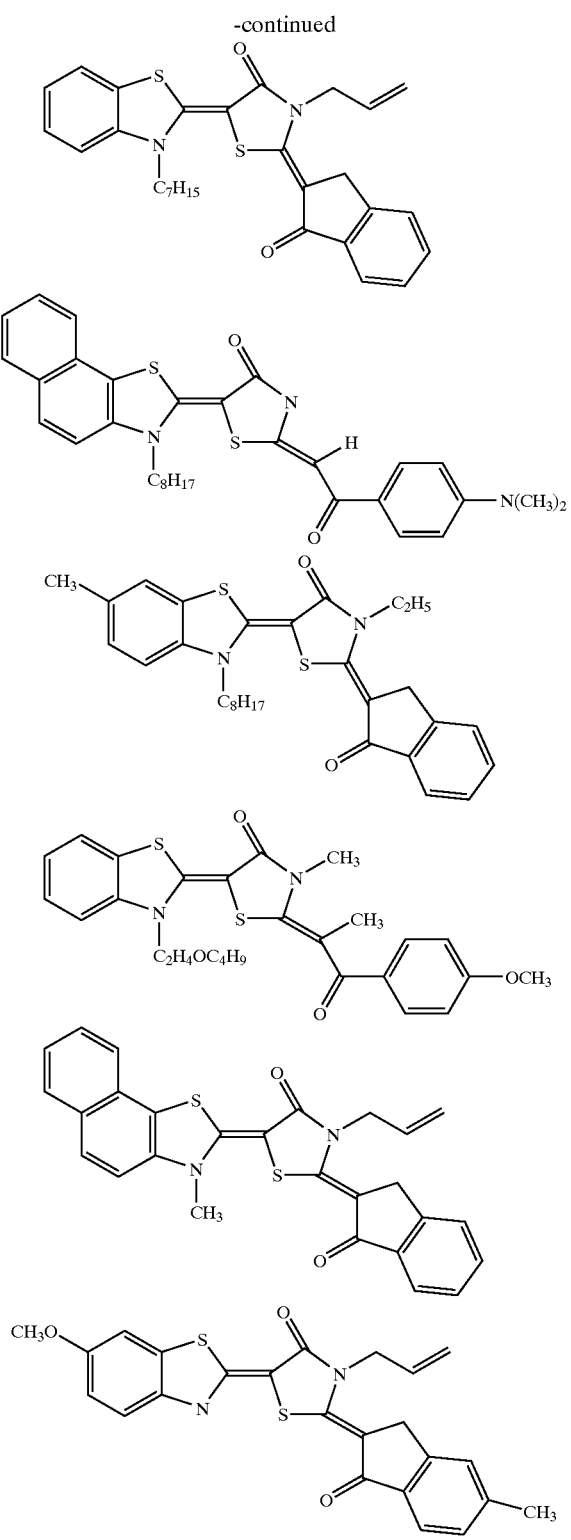

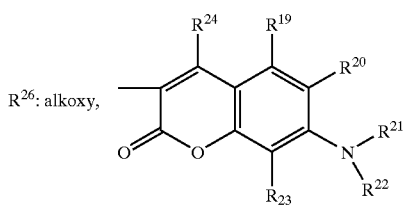

In the above formula, $R^{19}$, $R^{20}$ and $R^{21}$ each independently represents a hydrogen atom, halogen atom, alkyl group or alkoxyl group, $R^{21}$ and $R^{23}$ each represents alkyl group, provided that at least one group represents alkyl group having 4 to 16 carbon atoms, $R^{24}$ represents a hydrogen atom, alkyl group, alkoxyl group, acyl group, cyano group, carboxyl group or ester or amide derivative thereof; $R^{25}$ represents a residue of the heteroaromatic ring, having 3 to 17 total carbon atoms and is represented by $CO-R^{26}$, $R^{20}$ and $R^{21}$ and/or $R^{22}$ and $R^{23}$ may be bonded together to form a ring, and $R^{26}$ represents the following group.

$R^{26}$: alkoxy,

Examples of ketocoumarin dyes are shown below.

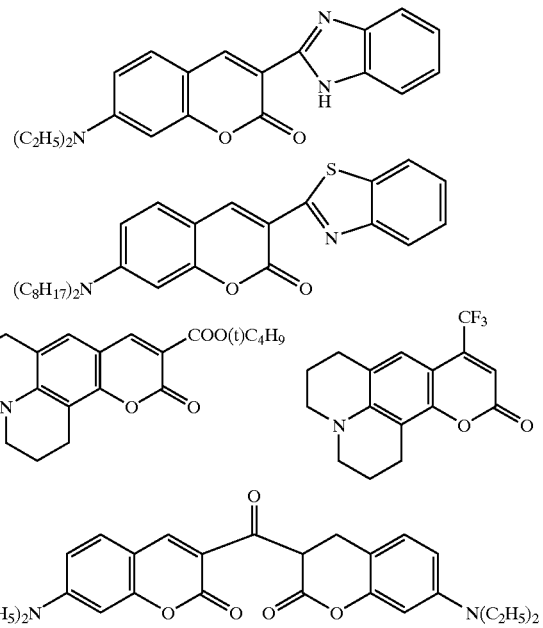

Examples of xanthene dyes include rhodamine B, rhodamine 6G, ethyleosin, alcohol-soluble eosin, pyronine Y, pyronine B and the like.

Preferred examples of ketocoumarin dyes are shown below, but not limited thereto.

Preferred examples of benzopyran dyes include the compounds represented by the following formula, but are not limited thereto.

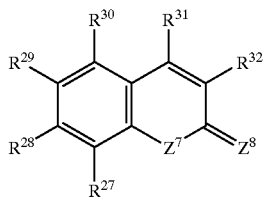

In the above formula, $R^{27}$, $R^{28}$ and $R^{29}$ are independently chosen from a hydrogen atom, halogen atom, alkyl group, aryl group, hydroxyl group, alkoxyl group and amino group. Also, $R^{27}$, $R^{28}$ and $R^{29}$ may form a ring consisting of non-metallic atoms together with the carbon atoms bonded thereto. $R^{31}$ represents a hydrogen atom, alkyl group, aryl group, heteroaromatic group, cyano group, alkoxyl group, carboxyl group or alkenyl group. $R^{29}$ represents a group of $R^{31}$, or —$Z^9$—$R^{31}$, wherein $Z^9$ represents a carbonyl group, sulfonyl group, sulfinyl group or arylene dicarbonyl group. Alternatively, $R^{31}$ and $R^{32}$ together may form a ring consisting of non-metallic atoms. $Z^7$ represents O, S, NH or nitrogen atom comprising a substituent thereon.

$Z^8$ represents the following group:

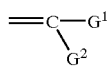

wherein $G^1$ and $G^2$ may be the same or different and represent a hydrogen atom, cyano group, alkoxycarbonyl group, aryloxycarbonyl group, acyl group, arylcarbonyl group, alkylthio group, arylthio group, alkylsulfonyl group, arylsulfonyl group or fluorosulfonyl group, but $G^1$ and $G^2$ do not represent hydrogen atom simultaneously. In addition, $G^1$ and $G^2$ may form a ring consisting of non-metallic atoms together with a carbon atom.

Examples of benzopyran dyes are shown below.

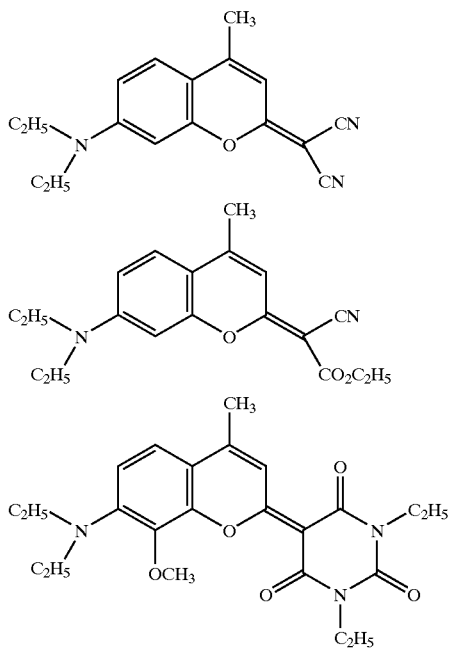

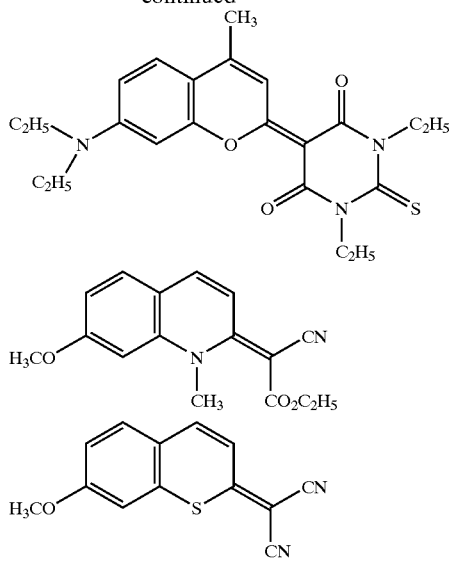

Moreover, it is known that a photoinitiation capability of the above described photopolymerization initiator further increases by optionally adding to the initiator a hydrogen-donating compound such as thiol compounds, e.g., 2-mercaptobenzthiazole, 2-mercaptobenzimidazole, and 2-mercaptobenzoxazole, and amine compounds, e.g., N-phenylglycine, N,N-dialkylaminoarylcarboxylic acid alkyl ester.

The amount of the photopolymerization initiator (or system) to be used ranges from 0.05 to 100 parts by weight, preferably from 0.1 to 70 parts by weight, and more preferably from 0.2 to 50 parts by weight, per 100 parts by weight of ethylenically unsaturated bond-containing compound.

The binder polymer used in the photosensitive layer of the PS plate of the present invention should be a film-forming material as well as an alkali developer-soluble material. Therefore, an organic polymer compound that is soluble or swellable in an alkali water may be used. Thus, if a water-soluble organic polymer is used, a photopolymerizable composition can be developed with water. Examples of such an organic polymer compound that is soluble or swellable in an alkali water include addition polymers having carboxyl groups on the side chains such as methacrylic copolymers, acrylic copolymers, itaconic acid copolymers, crotonic acid copolymers, maleic acid copolymers, and partially esterified maleic acid copolymers as disclosed in J.P.KOKAI Nos. Sho 59-44615, 54-92723, 59-53836 and 59-71048, and J.P.KOKOKU Nos. 54-34327, 58-12577 and 54-25957.

Also, an acidic cellulose derivative having a carboxyl group on the side chain can be utilized in the binder polymer of the present invention. In addition, a polymer that is formed by adding a cyclic acid anhydride to an addition polymer having a hydroxyl group can be used. Among these compounds, [benzyl (meth)acrylate/(meth)acrylic acid/other optional addition-polymerizable vinyl monomer] copolymers and [allyl (meth)acrylate/(meth)acrylic acid/other optional addition-polymerizable vinyl monomer] copolymers are preferred. In addition, polyvinyl pyrrolidone and polyethylene oxide are useful as a water-soluble organic polymer. Alcohol-soluble polyamides and polyethers such as a reaction product of 2,2-bis-(4-hydroxyphenyl)-propane with epichlorohydrin are also useful for the improvement of the strength of the cured film. In addition, polyurethane resins described in J.P. KOKOKU Nos. Hei 7-120040, Hei 7-120041, Hei 7-120042, Hei 8-12424, J.P. KOKAI Nos. Sho 63-287944, Sho 63-287947, Hei 1-271741, and Hei 11-352691 are also useful in the present invention.

The strength of the cured film can be increased by introducing a radical reactive group into the side chain of the above described organic polymer compound.

Examples of the addition polymerizable group include ethylenically unsaturated group, amino group, epoxy group and the like. Examples of a functional group which becomes a free radical upon exposure to light include mercapto group, thiol group, halogen atom, triazine structure, onium salt structure and the like. In addition, examples of a polar group that may be present in the binder polymer compound include carboxyl group, imide group and the like. In particular, ethylenically unsaturated groups such as acryl group, methacryl group, allyl group, and styryl group are preferred as an addition polymerizable functional group. Also, a functional group selected from the group consisting of amino group, hydroxyl group, phosphonic acid group, phosphoric acid group, carbamoyl group, isocyanate group, ureide group, ureylene group, sulfonic acid group, and ammonio group can be utilized.

In order to maintain the developability of the composition, the binder polymer compound used in the present invention preferably comprises a suitable molecular weight and suitable acid number. That is, a polymer compound having a weight average molecular weight ranging from 5,000 to 300,000 and having an acid number ranging from 20 to 200 may be effectively utilized. These organic polymer compounds can be incorporated into the photopolymerizable composition in any suitable amount. However, if the amount thereof exceeds 90% by weight, undesirable problems would arise. For instance, the formed image may have an insufficient strength. The amount thereof is preferably from 10% to 90% by weight and more preferably from 30% to 80% by weight. The weight ratio of the photopolymerizable ethylenically unsaturated compound to the organic polymer compound is preferably from 1/9 to 9/1, more preferably from 2/8 to 8/2 and 7/3 and further preferably from 3/7 to 7/3.

Moreover, the photosensitive layer usable in the present invention may preferably comprise a small amount of a heat polymerization inhibitor, in addition to the principal components described above, to inhibit unnecessary heat polymerization of the polymerizable ethylenically unsaturated bond-containing compound during the preparation of the photosensitive composition or storage thereof. Specific examples of the heat polymerization inhibitor effectively used are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerium salt, and N-nitrosophenylhydroxylamine aluminum salt.

The amount of the heat polymerization inhibitor based on the total weight of the photosensitive composition is preferably from about 0.01 to about 5% by weight. Also, if necessary, a higher fatty acid derivative such as behenic acid and behenic acid amide may be added to the photosensitive composition to inhibit the blocking of polymerization by oxygen. The higher fatty acid derivative may be distributed on the surface of the photosensitive layer during drying process after application. The amount of the higher fatty acid derivative is preferably in the range of about 0.5 to about 10% by weight based on the total weight of the photosensitive composition.

In addition, a coloring agent may be added to the photosensitive layer to color the layer. Examples of the coloring agent include phthalocyanine pigments (C. I. Pigment Blue 15:3, 15:4, 15:6 and the like), azo pigments, carbon black, titanium oxide pigments, ethyl violet, crystal violet, azo dyes, anthraquinone dyes, and cyanine dyes. The amount of the dyes or pigments preferably ranges from about 0.5% to about 20% by weight on the basis of the total weight of the photosensitive composition. Additionally, in order to improve the property of the formed film, an additive such as an inorganic filler and plasticizer, e.g., dioctyl phthalate, dimethyl phthalate and tricresyl phosphate, can be added. The amount of the additive is preferably 10% by weight or less based on the total weight of the photosensitive composition.

The photosensitive composition used for the PS plate of the present invention may be dissolved in a variety of organic solvents when the composition is applied onto the foregoing intermediate layer. Examples of the organic solvents include acetone, methyl ethyl ketone, cyclohexane, ethyl acetate, ethylene dichloride, tetrahydrofuran, toluene, ethyleneglycol monomethyl ether, ethyleneglycol monoethyl ether, ethyleneglycol dimethyl ether, propyleneglycol monomethyl ether, propyleneglycol monoethyl ether, acetylacetone, cyclohexanone, diacetone alcohol, ethyleneglycol monomethyl ether acetate, ethyleneglycol ethyl ether acetate, ethyleneglycol monoisopropyl ether, ethyleneglycol monobutyl ether acetate, 3-methoxypropanol, methoxymethoxyethanol, diethyleneglycol monomethyl ether, diethyleneglycol monoethyl ether, diethyleneglycol dimethyl ether, diethyleneglycol diethyl ether, propyleneglycol monomethyl ether acetate, propyleneglycol monoethyl ether acetate-3-methoxypropyl acetate, N,N-dimethylformamide, dimethylsulfoxide, γ-butyrolactone, methyl lactate, ethyl lactate and the like. The solvent can be used alone or in a combination. A suitable concentration of the solid in the coating solution ranges from 1% to 50% by weight.

The photopolymerizable composition used for the photosensitive layer of the PS plate of the present invention may further comprise a surfactant to improve the property of the coated surface. The amount the surfactant in the photosensitive layer suitably ranges from about 0.1 $g/m^2$ to about 10 $g/m^2$, preferably from 0.3 to 5 $g/m^2$, and more preferably from 0.5 to 3 $g/m^2$, based on the dried weight of the photosensitive layer.

A protective layer having an oxygen-barrier property can be optionally applied onto the layer of the photopolymerizable composition on a substrate for eliminating the polymerization-inhibitory effect of oxygen in the air. Examples of a water-soluble vinyl polymer comprised in such a protective layer having an oxygen-barrier property include polyvinyl alcohol, partial ester, ether, or acetal thereof and a copolymer thereof comprising a substantial amount of unsubstituted vinyl alcohol unit which makes the compounds water-soluble. Examples of the polyvinyl alcohol include those having a degree of saponification of 71% to 100% and a degree of polymerization of 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, L-8 (available from Kuraray Co. Ltd.) and the like. Examples of the copolymer include a copolymer of polyvinyl acetate, polyviny chloroacetate, polyvinyl propionate, polyvinyl formal or polyvinyl acetal and copolymers thereof, which are saponified to a degree of 88% to 100%. In addition, examples of the other useful polymers for the protective layer include polyvinylpyrrolidone, gelatin, and gum arabic. The polymers can be used alone or in a combination.

A solvent to be used for coating the protective layer having an oxygen-barrier property is preferably pure water. But, a blend of pure water and alcohols such as methanol and ethanol and/or ketones such as acetone and methyl ethyl ketone may be utilized. The amount of the solid in the coating solution suitably ranges from 1% to 20% by weight.

In addition, the protective layer having an oxygen-barrier property may comprise known additives such as a surfactant to improve an application property of the layer and a plasticizer to improve a film property. As an aqueous plasticizer, for example, propionamide, cyclohexanediol, glycerin, sorbitol and the like may be added. Also, aqueous (meth)acrylic polymers can be added. The amount of the additives after being dried suitably ranges from about 0.1 g/m$^2$ to about 15 g/m$^2$, and preferably from about 1.0 g/m$^2$ to about 5.0 g/m$^2$.

Hereinafter, a method for making a lithographic printing plate of the present invention will be specifically described. The PS plate described above is imagewise exposed to light and then, developed with a developer comprising an inorganic alkali salt and a nonionic surfactant comprising a polyoxyalkylene ether group.

The novel developer utilized in the present invention will be described below.

(Developer)

The developer used in the method for making a lithographic printing plate of the present invention comprises at least one inorganic alkali salt and at least one nonionic surfactant. In addition, the developer preferably has a pH ranging from 10.0 to 12.7 and has a conductivity ranging from 3 to 30 mS/cm.

Examples of the inorganic alkali salt include any alkali agent, preferably those having the above-described property. Specific examples thereof include inorganic alkali agents such as trisodium phosphate, tripotassium phosphate, triammonium phosphate, sodium carbonate, potassium carbonate, ammonium carbonate, sodium bicarbonate, potassium bicarbonate, ammonium bicarbonate, sodium borate, potassium borate, ammonium borate, sodium hydroxide, potassium hydroxide, ammonium hydroxide, and lithium hydroxide.

Also, an organic alkali agent may be used as a secondary agent to aid a minute control of alkali concentration and an improvement of solubility of a photosensitive layer. Examples of the organic alkaline agent include monomethylamine, dimethylamine, trimethylamine, monoethyl amine, diethyl amine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and the like. These alkaline agents can be used alone or in a combination.

The developer utilized in the method of the present invention comprises a nonionic surfactant comprising a polyoxyalkylene ether group. The nonionic surfactant in the developer improves the solubility of a non-irradiated portion of the photosensitive layer of the present invention and decreases the permeability of the developer into an irradiated portion of the photosensitive layer. The following compound represented by the general formula (I) can be suitably utilized as the surfactant comprising a polyoxyalkylene ether group.

$$R^{40}-O-(R^{41}-O)_pH \qquad (I)$$

In the formula (I), $R^{40}$ represents an optionally substituted alkyl group having 3 to 15 carbon atoms, optionally substituted aromatic hydrocarbon group having 6 to 15 carbon atoms, or optionally substituted heteroaromatic ring having 4 to 15 carbon atoms, wherein the substituent on these groups may include an alkyl group having 1 to 20 carbon atoms, halogen atom such as Br, Cl, I, etc., aromatic hydrocarbon group having 6 to 15 carbon atoms, aralkyl group having 7 to 17 carbon atoms, alkoxyl group having 1 to 20 carbon atoms, alkoxy-carbonyl group having 2 to 20 carbon atoms, and acyl group having 2 to 15 carbon atoms, $R^{41}$ represents an optionally substituted alkylene group having 1 to 100 carbon atoms, wherein the substituents on the group may include an alkyl group having 1 to 20 carbon atoms and aromatic hydrocarbon group having 6 to 15 carbon atoms, and p represents an integer of 1 to 100.

In the formula (I), specific examples of "aromatic hydrocarbon group" include phenyl group, tolyl group, naphthyl group, anthryl group, biphenyl group, and phenanthryl group; specific examples of "heteroaromatic ring" include furyl group, thionyl group, oxazolyl group, imidazolyl group, pyranyl group, pyridinyl, acridinyl group, benzofuranyl group, benzothionyl group, benzopyranyl group, benzoxazolyl group, and benzimidazolyl group.

In addition, if p is an integer of 2 to 100, $R^{41}$ may be the same or different. Specific examples of such a group include a combination of ethyleneoxy group and propyleneoxy group, a combination of ethyleneoxy group and isopropyloxy group, a combination of ethyleneoxy group and butyleneoxy group, and a combination of ethyleneoxy group and isobutylene group, in which each group may be connected in a random or block manner. In the present invention, the nonionic surfactant comprising a polyoxyalkylene ether group may be used alone or in a combination. An effective amount of the surfactant to be used in a developer is in the range of 1 to 30% by weight and preferably from 2 to 20% by weight. If the amount of the surfactant is too small, the developability of the developer would be deteriorated. If the amount of the surfactant is excess, the printing durability would be deteriorated.

Examples of the nonionic surfactant comprising a polyoxyalkylene ether group represented by the above general formula (I) include polyoxyethylene alkyl ethers such as polyoxyethylene lauryl ether, polyoxyethylene cetyl ether, polyoxyethylene stearyl ether and the like, polyoxyethylene aryl ethers such as polyoxyethylene phenyl ether, polyoxyethylene naphthyl ether and the like, and polyoxyethylene alkylaryl ethers such as polyoxyethylene methylphenyl ether, polyoxyethylene octylphenyl ether, polyoxyethylene nonylphenyl ether and the like.

Further, the following other surfactants may be added to the developer used in the present invention; nonionic surfactants (e.g., polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate, and sorbitan trioleate, and monoglyceride alkyl esters such as glycerol monostearate, and glycerol monooleate); anionic surfactants (e.g., salts of alkylbenzenesulfonic acid such as sodium dodecylbenzenesulfonate, salts of alkylnaphthalenesulfonic acid such as sodium butylnaphthalenesulfonate, sodium pentylnaphthalenesulfonate, sodium hexylnaphthalenesulfonate, and sodium octylnaphthalenesulfonate, alkyl sulfates such as sodium laurylsulfate, salts of alkylsulfonic acid such as sodium dodecylsulfonate, and salts of sulfosuccinic acid ester such as sodium dilauryl sulfosuccinate); and amphoteric surfactants (e.g., alkylbetaine such as laurylbetaine and stearylbetaine, and amino acids), with the anionic surfactants such as alkylnaphthalenesulfonic acid salt being particularly preferred.

These surfactants may be used alone or in a combination. The amount of the surfactant in the developer is suitably in the range of 0.1 to 20% by weight, which the amount is calculated based on the weight of the effective component in the surfactant.

The preferred pH of the developer used in the present invention is in the range of 10.0 to 12.7. If the pH of the developer is lower than 10.0, it is not possible to form an image. In contrast, if the pH of the developer is higher than 12.7, it causes problems such as an over-development of the plate or a damage of an irradiated portion during the development. The more preferable range of pH is from 11.0 to 12.5.

The developer utilized in the present invention preferably has conductivity in the range of 3 to 30 mS/cm. If the conductivity of the developer is lower than the range, generally, it is difficult to elute (dissolve) the photosensitive composition on an aluminum substrate to thus result in a contamination in the plate during printing process. If the conductivity is higher than the range, an elution rate of the photosensitive composition becomes so slow to generate a remain of a non-irradiated portion of a film due to a high concentration of a salt. In particular, the conductivity is preferably in the range of 5 to 20 mS/cm.

(Exposure to Light and Development)

The PS plate of the present invention is imagewise exposed to a conventional active light such as carbon arc lamps, high pressure mercury lamps, xenon lamps, metal halide lamps, fluorescent lamps, tungsten lamps, halogen lamps, helium-cadmium laser, argon ion laser, FD•YAG laser, helium-neon laser and semiconductor rays (350 nm to 600 nm). Then, the plate was developed with a developer to form an image on the surface of the aluminum plate. After being imagewise exposed to light and before being developed, the plate may be heated at 50° C. to 150° C. for 1 second to 5 minutes in order to enhance the degree of polymerization of the photopolymerizable photosensitive layer.

Typically, an overcoat layer having an oxygen barrier property is coated on a photosensitive layer of the PS plate of the present invention as described above. It is known that such an overcoat layer may be removed simultaneously with the remove of the non-irradiated portion of the photosensitive layer with a developer, or may be removed with water or hot water before removing the non-irradiated portion of the photosensitive layer with a developer. Such water or hot water may comprise preservatives as described in J.P. KOKAI No. Hei 10-10754 and organic solvents as described in J.P. KOKAI No. Hei 8-278636.

The development of the PS plate of the present invention with the developer described above may be conducted under the conventional condition, that is, by immersing the imagewise exposed plate in the developer at 0 to 60° C., preferably at 15 to 40° C. and by rubbing the plate with a brush.

In addition, in the case that the development process is conducted using an automatic development machine, a developability of a developer used therein (capability of the developer to sufficiently develop the plate) may be recovered by adding a replenisher or a fresh developer when the developer becomes exhausted after a large number of plates are treated.

The thus treated plate is then, generally treated with water, a rinse comprising a surfactant, and/or a solution for desensitizing the plate to grease comprising gum arabic, starch derivatives and the like, as described in J.P. KOKAI Nos. Sho 54-8002, Sho 55-115045, and Sho 59-58431. The PS plate of the present invention may be subjected to various combinations of the treatments.

The thus treated plate may be further subjected to a heat treatment such as a burning or to a treatment after an exposure to light as described in J.P. KOKAI No. 2000-89478 to improve the printing durability of the plate.

Thus obtained lithographic printing plate is set on an offset press and then is used for printing.

EXAMPLES

Hereinafter, the present invention will be explained more specifically by Examples, but the present invention is not limited thereto.

Example 1

A 1S aluminum plate having a thickness of 0.30 mm was surface-grained with a No.8 nylon brush and a suspension of 800 mesh pumice stone in water and then sufficiently washed with water. After the plate was etched by immersing it in an aqueous solution of 10% sodium hydroxide for 60 seconds at 70° C., the plate was washed with running water. Then the plate was washed with 20% $HNO_3$ to neutralize it and washed with water. Then, an electrolytic graining of the plate was conducted in a 1% aqueous solution of nitric acid using a rectangle alternating continuous wave voltage with an anode electric amount of 300 coulomb/$dm^2$ under the condition of $V_A$=12.7V. The roughness of the surface of the plate determined with an experimental device: SURFCOM available from Tokyo Seimitsu Co. Ltd., with a needle having a tip diameter of 2 μm, was 0.45 μm (Ra). The plate was then immersed in a 30% $H_2SO_4$ for 2 minutes at 55° C. to desmut the surface. Then, the plate was anodized in a 20% aqueous solution of $H_2SO_4$ at 33° C. by placing a cathode on the grained surface using an electric current density of 5A/$dm^2$ for 50 seconds to obtain a substrate having an anodized layer of which thickness was 2.7 g/$m^2$.

On the treated aluminum plate, a solution of methyl methacrylate/ethyl acrylate/2-acrylamide-2-methylpropanesulfonic acid, sodium salt copolymer (60/25/15 molar ratio, molecular weight Mn=30,000) in water/methanol=5 g/95 g was coated and the plate was dried at 80° C. for 30 seconds to form an intermediate layer. The thickness of the intermediate layer was 3 mg/$m^2$. A highly sensitive photopolymerizable composition P-1 described below was coated on the intermediate layer so that the dried weight thereof became 1.5 g/$m^2$, and then the plate was dried at 100° C. for 1 minute to form a photosensitive layer.

| (Photopolymerizable composition P-1) | |
|---|---|
| Ethylenically unsaturated bond containing compound (A1) | 1.5 part by weight |
| Linear organic polymer compound (polymer binder) (B1) | 2.0 part by weight |
| Sensitizer (C1) | 0.15 part by weight |
| Initiator of photopolymerization (D1) | 0.2 part by weight |
| ε-Phthalocyanine (F1) dispersion | 0.02 part by weight |
| Fluorine atom-containing nonionic surfactant, MEGAFAC F-177 (Dainippon Ink and Chemicals, Inc.) | 0.03 part by weight |

-continued

| | |
|---|---|
| Methyl ethyl ketone | 9.0 part by weight |
| Propyleneglycol monomethyl ether acetate | 7.5 part by weight |
| Toluene | 11.0 part by weight |

A1

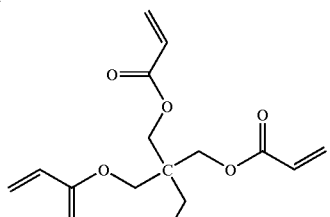

B1

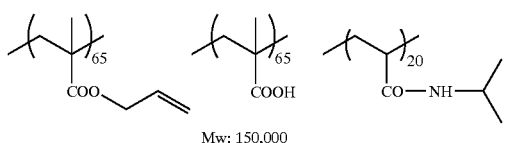

Mw: 150,000

C1

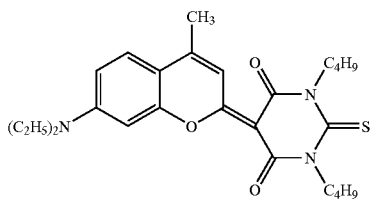

D1

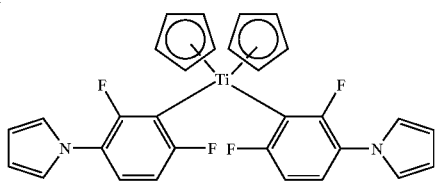

F1

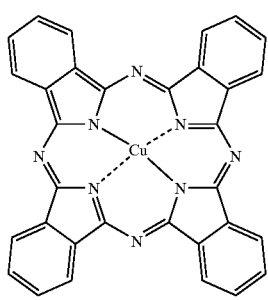

A 3% by weight solution of polyvinyl alcohol (the degree of saponification was 98% by mole and the degree of polymerization was 500) was coated on the photosensitive layer so that the dried weight of the polyvinyl alcohol became 2.5 g/m² and the coating was dried at 120° C. for 3 minutes to obtain a PS plate.

In order to know a level of contamination of a lithographic printing plate under an aging condition, the PS plate was stored for 5 days at 50° C. in 80% RH, which the condition simulates an aging condition.

The PS plate before and after being stored under the simulative aging condition was exposed to light with 100 μJ/cm² of FD·YAG laser (Plate Jet 4, available from CSI company) by scanning 1 to 99% of dot image (by 1%) and solid image on the plate under a condition of 4000 dpi and 175 lines/inch. Then, the plate was subjected to a standard treatment in an automatic developing machine (LP-850P2, available from Fuji Photo Film Co. Ltd.) comprising Developer 1 and a finishing gum liquid FP-2W (available from Fuji Photo Film Co. Ltd.). Preheating of the plate was conducted at a temperature on the surface of plate of 100° C., a developing temperature of 30° C., and an immersing time in a developer of about 15 seconds.

Developer 1 contains the components described below and has a pH of 11.5 at 25° C. and conductivity of 5 mS/cm.

| (Developer 1) | |
|---|---|
| Potassium hydroxide | 0.15 g |
| Polyoxyethylene phenyl ether (n = 13) | 5.0 g |
| CHELEST 400 (chelating agent) | 0.1 g |
| Water | 94.75 g |

Examples 2 to 5

The same procedure as described in Example 1 was repeated except that the copolymer component for an intermediate layer in Table 2 was substituted for the copolymer component for the intermediate layer described in Example 1 to obtain a lithographic printing plate before and after being stored under the aging condition.

TABLE 2

Copolymer component for an intermediate layer (% by mole)

| | Composition | | | |
|---|---|---|---|---|
| Components | A | B | C | D |
| methyl methacrylate | 30 | — | — | 40 |
| N-t-butylacrylamide | — | 40 | 50 | — |
| methyl acrylate | 40 | 40 | 30 | 40 |
| sodium p-styrenesulfonate | 30 | 10 | — | — |
| sodium 2-acrylamide-2-methylpropanesulfonate | — | 10 | 15 | 10 |
| sodium vinylsulfonate | — | — | 5 | — |
| methacrylic acid | — | — | — | 10 |
| weight-average molecular weight | 80,000 | 40,000 | 20,000 | 60,000 |

Examples 6 to 8

The same procedure as described in Example 1 was repeated except that the coating amount of the intermediate layer in Example 1 was changed to 1 mg/m², 5 mg/m² and 8 mg/m² to obtain the lithographic printing plates of Examples 6 to 8.

Examples 9 to 11

The same procedure as described in Example 6 was repeated except that linear organic polymer compound B2 or B3 was substituted for B1 in photopolymerizable composition P-1 described in Example 1 (that is, photopolymerizable composition P-2 or P-3 was used instead of P-1) to obtain lithographic printing plates of Examples 9 and 10.

B2 (P-2): allyl methacrylate/methacrylic acid (70/30% by mole) copolymer, molecular weight: 50,000.
B3 (P-3): methyl methacrylate/isobutyl methacrylate/methacrylic acid (60/20/20% by mole) copolymer, molecular weight 100,000.

The same procedure as described in Example 6 was repeated except that the following compound (A2) was substituted for A1 (that is, ethylenically unsaturated bond-containing compound P-4 was used) to obtain a lithographic printing plate of Example 11.

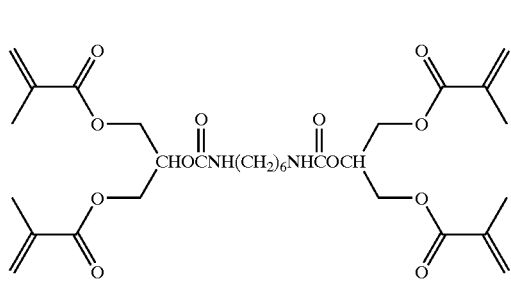

A2

Examples 12 to 15

The same procedure as described in Example 1 was repeated except that Developer 2, 3 or 4 in Table 3 was substituted for Developer 1 in Example 1 to obtain lithographic printing plates of Examples 12 to 15.

TABLE 3

| | | pH | conductivity |
|---|---|---|---|
| Developer 2 | | | |
| potassium hydroxide | 0.15 g | 11.8 | 5 mS/cm |
| polyoxyethylene methylphenyl ether (n = 10) | 5.0 g | | |
| CHELEST 400 | 0.1 g | | |
| water | 94.75 g | | |
| Developer 3 | | | |
| potassium hydroxide | 0.15 g | 11.7 | 6 mS/cm |
| polyoxyethylene naphthyl ether (n = 10) | 5.0 g | | |
| CHELEST 400 | 0.1 g | | |
| water | 94.75 g | | |
| Developer 4 | | | |
| potassium hydroxide | 0.15 g | 11.9 | 6 mS/cm |
| triethanolamine | 1.35 g | | |
| polyoxyethylene phenyl ether (n = 12) | 5.0 g | | |
| CHELEST 400 | 0.1 g | | |
| water | 93.4 g | | |
| developer 5 | | | |
| potassium hydroxide | 0.15 g | 12.3 | 8 mS/cm |
| polyoxyethylene naphthyl ether (n = 10) | 5.0 g | | |
| ANON LG | 1.0 g | | |
| CHELEST 400 | 0.1 g | | |
| p-t-butylbenzoic acid | 1.0 g | | |
| water | 92.3 g | | |

Comparative Example 1

The same procedure as described in Example 1 was repeated except that the aluminum substrate was treated so that the roughness of the surface became 0.70 μm (Ra) to obtain a lithographic printing plate.

Comparative Example 2

The same procedure as described in Example 1 was repeated except that the intermediate layer described in Example 1 was not formed, to obtain a lithographic printing plate.

Comparative Example 3

The same procedure as described in Example 1 was repeated except that Developer 6 comprising an amphoteric surfactant and an alkali metal silicate salt ($SiO_2/K_2O$), that is, a solution obtained by diluting LP-D developer available from Fuji Photo Film Co. Ltd with water, was used in place of Developer 1 described in Example 1, and that the PS plate prepared in the Comparative Example 1 was used in place of the PS plate in Example 1. Developer 6 does not comprise any nonionic surfactant comprising polyoxyalkylene ether group. In addition, pH of Developer 6 was 12.8 and conductivity was 32 mS/cm.

Printing durability and background contamination were evaluated for the lithographic printing plates obtained by the methods described in Examples 1 to 15 and Comparative Examples 1 to 3.

Printing operation with a lithographic printing plate was conducted using R201-type printer available from Man•Roland company and GEOS G black (N) ink (available from Dainippon Ink and Chemicals, Inc.) and the number of printings obtained before dots loss on 3% mesh was observed was determined to evaluate the printing durability of the lithographic printing plate.

The background contamination was evaluated by visibly checking the presence of a contamination when the printing operation with a lithographic printing plate was conducted using Daiya IF2 printer available from Mitsubishi Heavy Industries, Ltd., and GEOS G Red (S) available from Dainippon Ink and Chemicals, Inc. The results are shown in Table 4.

TABLE 4

| | Before being stored | | After being stored for 5 days at 50° C. and 80% RH | |
|---|---|---|---|---|
| | Background contamination | Printing durability (number of copies) | Background contamination | Printing durability |
| Example 1 | None | 150,000 | None | 140,000 |
| Example 2 | None | 180,000 | None | 180,000 |
| Example 3 | None | 150,000 | None | 150,000 |
| Example 4 | None | 150,000 | None | 140,000 |
| Example 5 | None | 120,000 | None | 130,000 |
| Example 6 | None | 150,000 | None | 150,000 |
| Example 7 | None | 140,000 | None | 140,000 |
| Example 8 | None | 150,000 | None | 150,000 |
| Example 9 | None | 180,000 | None | 160,000 |
| Example 10 | None | 130,000 | None | 130,000 |
| Example 11 | None | 140,000 | None | 140,000 |
| Example 12 | None | 150,000 | None | 140,000 |
| Example 13 | None | 150,000 | None | 150,000 |
| Example 14 | None | 130,000 | None | 130,000 |
| Example 15 | None | 170,000 | None | 150,000 |
| Comp. Ex. 1 | None | 150,000 | Slightly contaminated | 140,000 |
| Comp. Ex. 2 | Slightly contaminated | 30,000 | Severely contaminated | 40,000 |
| Comp. Ex. 3 | Slightly contaminated | 40,000 | Slightly contaminated | 40,000 |

As seen from Table 3, every printing plate of the Examples of the present invention gave good results. In contrast, the printing plate of Comparative Example 1 comprising an aluminum plate of which the surface roughness was not within the range of the present invention (0.70 μm) showed background contamination when the plate was stored at high temperature under high humidity. Also, the printing plate of Comparative Example 2 having no intermediate layer showed a background contamination even before storage and showed a heavy contamination after storage. In addition, the printing plate of Comparative Example 2 showed low printing durability both before and after storage. When the printing plate prepared in Comparative Example 1 comprising an aluminum plate of which the surface roughness was not within the range of the present invention (0.70 µm) was developed with a developer comprising no inorganic alkali salt and no polyoxyalkylene ether group (Comparative Example 3), background contamination was observed in both the case, before and after storage and printing durability was deteriorated. As seen from the above, the method of the present invention provides a lithographic printing plate which shows no background contamination even after storage under a simulative aging condition and high printing durability.

Thus, the PS plate of the present invention comprising an intermediate layer comprising a polymer compound comprising a sulfonic acid-containing monomer unit on an aluminum substrate having a specific surface roughness and a photopolymerizable photosensitive layer on the intermediate layer and the method for preparing a lithographic printing plate of the present invention including developing the plate with a developer having a relatively low pH and comprising a specific nonionic surfactant, provide a lithographic printing plate showing good contrast between an image area and non-image area, no background contamination during printing, good stability with time and good printing durability. In addition, the developer to be used in the method of the present invention has a relatively low pH and thus, the method of the present invention can be safely utilized and provides an effect to reduce the influence of a waste of the developer on an environment.

What is claimed is:

1. A presensitized plate useful for making a lithographic printing plate comprising an intermediate layer and a photopolymerizable photosensitive layer on an aluminum substrate in this order, wherein the roughness of a surface of said aluminum substrate (Ra) is in the range of 0.2 to 0.55 µm, the intermediate layer comprises a polymer compound comprising at least one monomer unit having a sulfonic acid group and the photopolymerizable photosensitive layer comprises an ethylenically unsaturated bond-containing compound, a photopolymerization initiator which is a combination of a titanocene and a dye selected from the group consisting of cyanine dyes, merocyanine dyes, xanthene dyes, ketocoumarin dyes, and benzopyran dyes, and a polymer binder.

2. The presensitized plate of claim 1, wherein said monomer unit having a sulfonic acid group in the polymer compound in the intermediate layer is derived from at least one monomer selected from the group consisting of p-styrenesulfonic acid, 2-acrylamide-2-methylpropane-sulfonic acid, ethylenesulfonic acid, alkali metal salt thereof, ammonium salt thereof and aqueous amine salt thereof.

3. A method for making a lithographic printing plate comprising imagewise exposing the presensitized plate useful for making a lithographic printing plate comprising an intermediate layer and a photopolymerizable photosensitive layer on an aluminum substrate in this order, wherein the roughness of a surface of said aluminum substrate (Ra) is in the range of 0.2 to 0.55 µm and the intermediate layer comprises a polymer compound comprising at least one monomer unit having a sulfonic acid group, and developing the imagewise exposed presensitized plate with a developer comprising an inorganic alkali salt and a nonionic surfactant comprising a polyoxyalkylene ether group.

4. The method of claim 3, wherein the developer has a pH ranging from 10.0 to 12.7 and has a conductivity ranging from 3 to 30 mS/cm.

5. The method of claim 3, wherein the nonionic surfactant comprising a polyoxyalkylene ether group is represented by the formula (I):

$$R^{40}\text{—O—}(R^{41}\text{—O})_p H \qquad (I)$$

wherein $R^{40}$ represents an optionally substituted alkyl group having 3 to 15 carbon atoms, optionally substituted aromatic hydrocarbon group having 6 to 15 carbon atoms, or optionally substituted heteroaromatic ring having 4 to 15 carbon atoms, wherein the substituent on these groups is selected from an alkyl group having 1 to 20 carbon atoms, halogen atom, aromatic hydrocarbon group having 6 to 15 carbon atoms, aralkyl group having 7 to 17 carbon atoms, alkoxyl group having 1 to 20 carbon atoms, alkoxy-carbonyl group having 2 to 20 carbon atoms, and acyl group having 2 to 15 carbon atoms, $R^{41}$ represents an optionally substituted alkylene group having 1 to 100 carbon atoms, wherein the substituents on the group is selected from an alkyl group having 1 to 20 carbon atoms and aromatic hydrocarbon group having 6 to 15 carbon atoms, p represents an integer of 1 to 100, and if p is an integer of 2 to 100, $R^{41}$ may be the same or different.

6. The method of claim 3, wherein the nonionic surfactant comprising a polyoxyalkylene ether group is selected from the group consisting of polyoxyethylene lauryl ether, polyoxyethylene cetyl ether, polyoxyethylene stearyl ether, polyoxyethylene phenyl ether, polyoxyethylene naphthyl ether, polyoxyethylene methylphenyl ether, polyoxyethylene octylphenyl ether, and polyoxyethylene nonylphenyl ether.

* * * * *